(12) United States Patent
Gao et al.

(10) Patent No.: US 9,654,870 B2
(45) Date of Patent: May 16, 2017

(54) METHOD, DEVICE, AND SYSTEM FOR PROCESSING DATA DURING IDLE LISTENING

(71) Applicants: Huawei Technologies Co., Ltd., Shenzhen (CN); Tsinghua University, Beijing (CN)

(72) Inventors: Bo Gao, Beijing (CN); Zhenyu Xiao, Beijing (CN); Pei Liu, Beijing (CN)

(73) Assignees: Huawei Technologies Co., Ltd., Shenzhen (CN); Tsinghua University, Beijing (CN)

( * ) Notice: Subject to any disclaimer, the term of this patent is extended or adjusted under 35 U.S.C. 154(b) by 45 days.

(21) Appl. No.: 14/708,991

(22) Filed: May 11, 2015

(65) Prior Publication Data
US 2015/0245135 A1 Aug. 27, 2015

Related U.S. Application Data

(63) Continuation of application No. PCT/CN2013/086945, filed on Nov. 12, 2013.

(30) Foreign Application Priority Data

Nov. 12, 2012 (CN) .......................... 2012 1 0450263

(51) Int. Cl.
*H03M 1/12* (2006.01)
*H04R 3/00* (2006.01)
(Continued)

(52) U.S. Cl.
CPC ............ *H04R 3/00* (2013.01); *H04W 52/028* (2013.01); *H04W 52/0245* (2013.01);
(Continued)

(58) Field of Classification Search
CPC H03M 1/12; H03M 1/00; H04L 7/042; H04L 27/2647
(Continued)

(56) References Cited

U.S. PATENT DOCUMENTS 5,386,438 A * 1/1995 England .............. H04L 27/0002
341/144
5,790,946 A 8/1998 Rotzoll
(Continued)

FOREIGN PATENT DOCUMENTS

CN 102185809 A 9/2011
CN 202035008 U 11/2011
(Continued)

OTHER PUBLICATIONS

"IEEE Standard for Information technology—Telecommunications and information exchange between systems; Local and metropolitan area networks—Specific requirements; Part 11: Wireless LAN Medium Access Control(MAC)and Physical Layer (PHY)Specifications; Amendment 3: Enhancements for Very High Throughput in the 60 GHz Band," IEEE Std 802.11ad™, Institute of Electrical and Electronics Engineers, New York, New York (Dec. 28, 2012).

*Primary Examiner* — Joseph Lauture
(74) *Attorney, Agent, or Firm* — Leydig, Voit & Mayer, Ltd.

(57) ABSTRACT

The present invention provides a method, a device and a system for processing data during idle listening. The method includes: sampling, in an idle listening mode, a first analog signal by using an N-bit ADC, and sampling, in a transceiving mode, a second analog signal by using an M-bit ADC, where N and M are both integers, and N is less than M. Embodiments of the present invention can reduce power consumption of an ADC during idle listening.

13 Claims, 6 Drawing Sheets

(51) Int. Cl.
*H04W 52/02* (2009.01)
*H04L 7/04* (2006.01)
*H03M 1/00* (2006.01)
*H04L 27/26* (2006.01)

(52) U.S. Cl.
CPC .......... *H04W 52/0283* (2013.01); *H03M 1/00* (2013.01); *H03M 1/12* (2013.01); *H04L 7/042* (2013.01); *H04L 27/2647* (2013.01); *H04W 52/0287* (2013.01); *Y02B 60/50* (2013.01)

(58) Field of Classification Search
USPC ......... 341/155, 110, 126; 375/343, 346, 121
See application file for complete search history.

(56) References Cited

U.S. PATENT DOCUMENTS

| | | |
|---|---|---|
| 2005/0176416 A1 | 8/2005 | Desch et al. |
| 2006/0178127 A1 | 8/2006 | Kawasaki |
| 2007/0097961 A1 | 5/2007 | Sun et al. |
| 2009/0282277 A1 | 11/2009 | Sedarat et al. |
| 2010/0008436 A1 | 1/2010 | Zhang et al. |
| 2011/0096875 A1 | 4/2011 | Amrutur et al. |
| 2012/0257558 A1 | 10/2012 | Shin et al. |

FOREIGN PATENT DOCUMENTS

| | | |
|---|---|---|
| CN | 102435336 A | 5/2012 |
| CN | 102598808 A | 7/2012 |
| CN | 102932888 A | 2/2013 |
| RU | 2008116167 A | 12/2009 |
| WO | WO 2011019483 A2 | 2/2011 |
| WO | WO 2012138947 A2 | 10/2012 |

\* cited by examiner

METHOD, DEVICE, AND SYSTEM FOR PROCESSING DATA DURING IDLE LISTENING

CROSS-REFERENCE TO RELATED APPLICATIONS

This application is a continuation of International Patent Application No. PCT/CN2013/086945, filed on Nov. 12, 2013, which claims priority to Chinese Patent Application No. 201210450263.3, filed on Nov. 12, 2012, both of which are hereby incorporated by reference in their entireties.

TECHNICAL FIELD

The present invention relates to communications technologies, and in particular, to a method, a device and a system for processing data during idle listening.

BACKGROUND

For countries in the world, there is a certification-free spectrum that is near a 60-gigahertz (GHz) frequency band and is up to several GHz, so a 60-GHz millimeter wave technology has an enormous communication capacity. However, a common problem faced by current 60-GHz chips is that power consumption is excessively large during idle listening, and for a handheld mobile device, high power consumption is unbearable.

SUMMARY

In view of this, embodiments of the present invention provide a method, a device and a system for processing data during idle listening, which are used for reducing power consumption during the idle listening.

According to a first aspect, a method for processing data during idle listening is provided, including:

sampling, in an idle listening mode, a first analog signal by using an N-bit ADC; and sampling, in a transceiving mode, a second analog signal by using an M-bit ADC, where N and M are both integers, and N is less than M.

With reference to the first aspect, in a first possible implementation manner of the first aspect, N is 1.

With reference to the first aspect or the first possible implementation manner of the first aspect, in a second possible implementation manner of the first aspect, wherein a first data sequence is obtained by the sampling the first analog signal by using the N-bit ADC the method further includes:

determining whether the first data sequence is a set data sequence; and the sampling, in a transceiving mode, a second analog signal by using an M-bit ADC includes:

when the first data sequence is the set data sequence, sampling the second analog signal by using the M-bit ADC to obtain a second data sequence.

With reference to the second possible implementation manner of the first aspect, in a third possible implementation manner of the first aspect, the determining whether the first data sequence is a set data sequence includes:

comparing an energy value of the first data sequence with an energy value of the set data sequence; if the two energy values are the same, the first data sequence is the set data sequence.

With reference to the second possible implementation manner of the first aspect, in a fourth possible implementation manner of the first aspect, the set data sequence includes an m sequence with r times of cycles, where a length of each m sequence is L, and r and L are both set values;

the second data sequence includes: data in a standard frame structure; and a time difference between the first data sequence and the second data sequence is a time occupied by a redundant bit, and the time occupied by the redundant bit is greater than or equal to a time required for switching from the N-bit ADC to the M-bit ADC.

According to a second aspect, a method for processing data during idle listening is provided, including:

generating a data sequence, and performing digital-to-analog conversion on the data sequence to obtain analog signals, where the analog signals includes a first analog signal and a second analog signal; and sending the analog signals to a receiving device, so that the receiving device samples, in an idle listening mode, the first analog signal by using an N-bit ADC, and samples, in a transceiving mode, the second analog signal by using an M-bit ADC, where N and M are both integers, and N is less than M.

With reference to the second aspect, in a first possible implementation manner of the second aspect, the data sequence includes:

a set data sequence, a redundant bit and data in a standard frame structure, where the set data sequence includes an m sequence with r times of cycles, a length of each m sequence is L, r and L are both set values, and a time occupied by the redundant bit is greater than or equal to a time required for switching from the N-bit ADC to the M-bit ADC.

With reference to the first possible implementation manner of the second aspect, in a second possible implementation manner of the second aspect, the first analog signal is an analog signal obtained after digital-to-analog conversion is performed on the set data sequence, and the second analog signal is an analog signal obtained after digital-to-analog conversion is performed on the data in the standard frame structure.

According to a third aspect, a receiving device is provided, including:

a first sampling unit, configured to sample, in an idle listening mode, a first analog signal by using an N-bit ADC; and a second sampling unit, configured to sample, in a transceiving mode, a second analog signal by using an M-bit ADC, where N and M are both integers, and N is less than M.

With reference to the third aspect, in a first possible implementation manner of the third aspect, the device further includes:

a processing unit, configured to determine whether the first data sequence is a set data sequence; and the second sampling unit is specifically configured to sample, when the processing unit determines that the first data sequence is the set data sequence, the second analog signal by using the M-bit ADC to obtain a second data sequence.

With reference to the first possible implementation manner of the third aspect, in a second possible implementation manner of the third aspect, the processing unit is specifically configured to:

compare an energy value of the first data sequence with an energy value of the set data sequence; if the two energy values are the same, determine that the first data sequence is the set data sequence.

According to a fourth aspect, a sending device is provided, including:

a processing unit, configured to generate a data sequence, and perform digital-to-analog conversion on the data sequence to obtain analog signals, where the analog signals includes a first analog signal and a second analog signal; and a sending unit, configured to send the analog signals to a receiving device, so that the receiving device samples, in an idle listening mode, the first analog signal by using an N-bit ADC, and samples, in a transceiving mode, the second analog signal by using an M-bit ADC, where N and M are both integers, and N is less than M.

With reference to the fourth aspect, in a first possible implementation manner of the fourth aspect, the data sequence includes:

a set data sequence, a redundant bit and data in a standard frame structure, where the set data sequence includes an m sequence with r times of cycles, a length of each m sequence is L, r and L are both set values, and a time occupied by the redundant bit is greater than or equal to a time required for switching from the N-bit ADC to the M-bit ADC.

With reference to the first possible implementation manner of the fourth aspect, in a second possible implementation manner of the fourth aspect, the first analog signal is an analog signal obtained after digital-to-analog conversion is performed on the set data sequence, and the second analog signal is an analog signal obtained after digital-to-analog conversion is performed on data in the standard frame structure.

According to a fifth aspect, a communications system is provided, including any one of the foregoing receiving devices and any one of the foregoing sending devices.

According to the foregoing technical solutions, an effective sampling bit width of an ADC that is used during idle listening is N, which is less than an effective sampling bit width M in a transceiving mode; when a performance coefficient is fixed, power consumption is directly proportional to an effective sampling bit width, so that when the effective sampling bit width is reduced, the power consumption is also reduced, and therefore using a small effective sampling bit width can reduce the power consumption during the idle listening when ADC performance is fixed.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show some embodiments of the present invention, and a person of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

In a 60-GHz wireless personal area network (Wireless Personal Area Network, WPAN) communications system, power consumed by chips during idle listening is high, and power consumed by some chips during idle listening is up to approximately 2 W, which severely limit market positioning and an application scope of the 60-GHz.

At a receiving end, a receiving device may first sample a received analog signal by using an analog-to-digital converter (Analog-to-Digital Converter, ADC) to obtain a digital signal, and then perform baseband and Media Access Control (Media Access Control, MAC) processing on the digital signal.

In power consumption that is during idle listening and in a 60-GHz WPAN, operating power consumption of an ADC with a multigigabit samples per second (Multi-Gsps) accounts for approximately 50%, and in an orthogonal frequency division multiplexing (OFDM) system of high order modulation, power consumption of an ADC accounts for a larger proportion. An important indicator for evaluating conversion performance of an ADC is a figure of merit (Figure of Merit, FOM), and a calculation formula of the FOM is as follows:

$$FOM = \frac{\text{power consumption}}{2^{ENOB} \times f_s} [pJ/conv]$$

Where power consumption is power consumption, ENOB is an effective sampling bit width, $f_s$ is a sampling rate, and pJ/conv represents picojoule per symbol variation.

In a case in which the FOM is assumed to be fixed, there are two methods to reduce power consumption of an ADC: one method is to reduce the sampling rate $f_s$ of the ADC, but in a ADC with multi-Gsps, implementation generally needs to be performed by using a deep submicron process, where power consumption of an analog part accounts for over 50%, therefore, an effect of solution that is implemented only by reducing the sampling rate of the ADC is limited, and an excessively low sampling rate severely affects performance of detection of an entire received frame. The other method is to reduce an effective sampling bit width ENOB of the ADC, and as the ENOB decreases, FOM conversion efficiency increases significantly; when the FOM is fixed, after the ENOB is reduced, power consumption is reduced too.

Therefore, the embodiments of the present invention reduce the ENOB during idle listening, so as to reduce power consumption.

Figure 1:
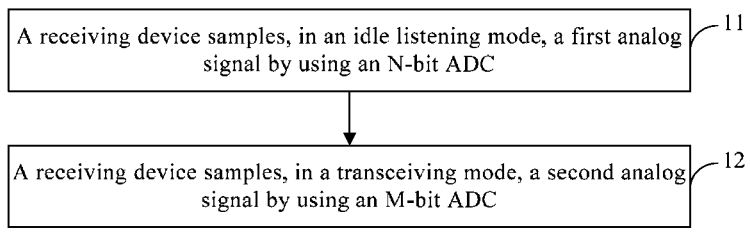
FIG. 1 is a schematic flowchart of a method for processing data during idle listening according to an embodiment of the present invention.

FIG. 1 is a schematic flowchart of a method for processing data during idle listening according to an embodiment of the present invention, where the method includes:

11: A receiving device samples, in an idle listening mode, a first analog signal by using an N-bit ADC.

12: The receiving device samples, in a transceiving mode, a second analog signal by using an M-bit ADC.

N and M are both integers, and N is less than M.

The foregoing N-bit ADC and M-bit ADC indicate that effective sampling bit widths of the ADCs separately are N and M.

The foregoing M is the effective sampling bit width required by the ADC when data is received or sent normally, and is generally a value greater than 1, for example, any value within 6 to 12. In the prior art, an analog signal is sampled by using an M-bit ADC no matter during normal data receiving or sending or during idle listening.

However, in the embodiment of the present invention, in order to reduce power consumption during idle listening, the value of M is reduced, and as described above, the N-bit ADC is configured to sample an analog signal, where N is less than M. In this way, when an FOM and a sampling rate are fixed, compared with that of original M-bit sampling, power consumption caused by N-bit sampling used in the embodiment is equivalent to only $$\frac{1}{2^{M-N}}$$

of original power consumption.

Figure 2:
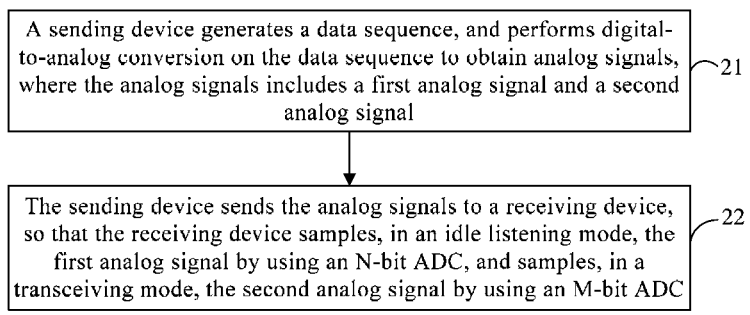
FIG. 2 is a schematic flowchart of a method for processing data during idle listening according to another embodiment of the present invention.

Accordingly, a procedure at a sending end provided in FIG. 2 includes:

21: A sending device generates a data sequence, and performs digital-to-analog conversion on the data sequence to obtain analog signals, where the analog signals include a first analog signal and a second analog signal.

22: The sending device sends the analog signals to a receiving device, so that the receiving device samples, in an idle listening mode, the first analog signal by using an N-bit ADC, and samples, in a transceiving mode, the second analog signal by using an M-bit ADC.

In the foregoing steps, N and M are both integers, and N is less than M.

In the embodiment, an effective sampling bit width is reduced during idle listening, so that power consumption may be reduced when performance of an ADC is fixed.

Figure 3:
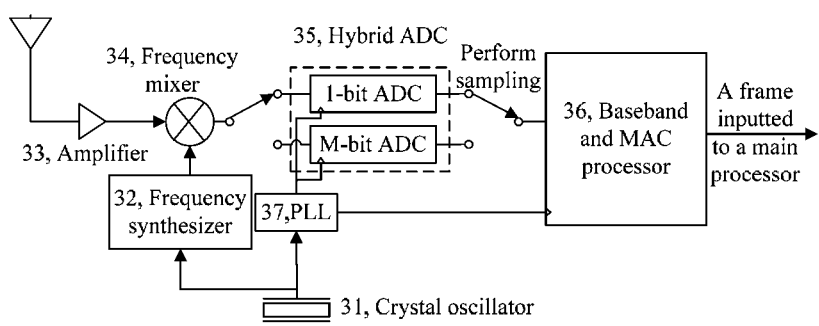
FIG. 3 is a schematic structural diagram of a receiving device according to an embodiment of the present invention.

The foregoing provides the embodiment in which N is less than M, a minimum value of N is 1, and therefore, in an implementation manner, N is 1. Referring to FIG. 3, a schematic structural diagram of a 60-GHz receiving device is provided, and the receiving device includes a crystal oscillator 31, a frequency synthesizer 32, an amplifier 33, a frequency mixer 34, a hybrid ADC 35, a baseband and MAC processor 36 and a phase locked loop (Phase Locked Loop, PLL) 37. The crystal oscillator 31 is configured to generate a clock frequency; the frequency synthesizer 32 is configured to perform a synthetic processing on the generated clock frequency to obtain a required synthesized frequency; the amplifier 33 is configured to perform amplification processing on an analog signal received by a radio frequency part; the frequency mixer 34 is configured to perform a down-conversion processing on the amplified analog signal; the hybrid ADC 35 is configured to sample the analog signal that is obtained after the down-conversion processing to obtain a digital signal; the baseband and MAC processor 36 is configured to perform baseband processing on the digital signal and output a signal to a main processor; the PLL 37 is configured to perform phase synchronization processing on signals from the hybrid ADC 35 and the baseband and MAC processor 36.

In the prior art, when sampling is performed, the sampling is performed by using an M-bit ADC no matter in a transceiving mode or in an idle listening mode. Different from that in the prior art, in the embodiment: in the transceiving mode, M-bit sampling is performed, so as to ensure that data including adequate information is sampled; in the idle listening mode, sampling is performed by using a 1-bit ADC, so as to reduce power consumption during idle listening. That is, the hybrid ADC 35 includes the 1-bit ADC and the M-bit ADC, where the 1-bit ADC operates during the idle listening and the M-bit ADC operates in the transceiving mode.

Switching is performed between ADCs of different bits, the receiving device need to learn about when to perform switching. In the embodiment of the present invention, when the receiving device during idle listening obtains a data sequence by using the 1-bit ADC based sampling, it is determined whether the data sequence is a set data sequence; and when the data sequence is the set data sequence, switching from the 1-bit ADC to the M-bit ADC is performed, and when the data sequence is not the set data sequence, sampling is performed still by using the 1-bit ADC.

Figure 4:
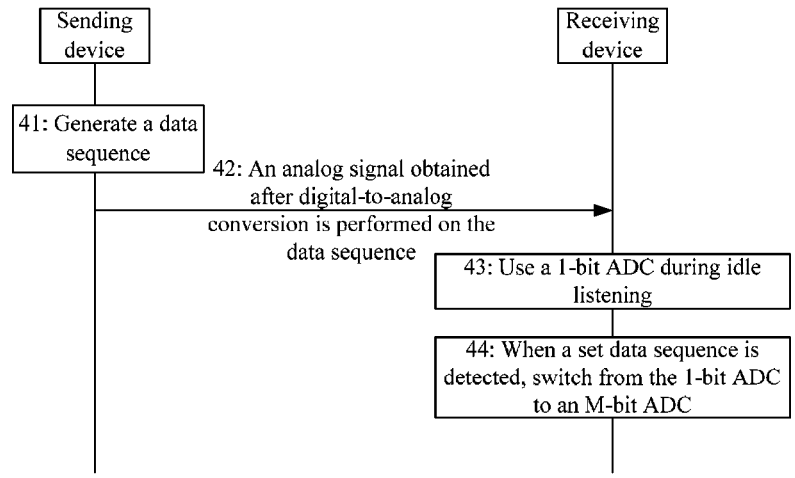
FIG. 4 is a schematic flowchart of a method for processing data during idle listening according to another embodiment of the present invention.

FIG. 4 is a schematic flowchart of a method for processing data during idle listening according to another embodiment of the present invention, where the method includes:

41: A sending device generates a data sequence, where the data sequence includes: a set data sequence, a redundant bit and data in a standard frame structure.

Figure 5:
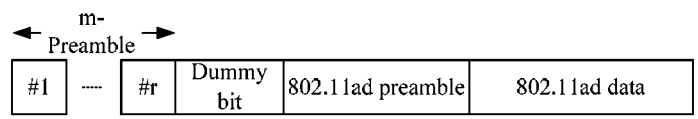
FIG. 5 is a schematic structural diagram of a sent data frame according to an embodiment of the present invention.

In the present invention, the data sequence generated by the sending device, that is, a data frame used for communication, is an improved data sequence based on an existing 60-GHz communication frame structure, and in addition to data in an existing standard frame structure, further includes the set data sequence and the redundant bit, as specifically shown in FIG. 5.

The set data sequence is represented by an m-preamble (m-preamble), and the redundant bit is represented by a dummy bit. The data in the standard frame structure may be a 802.11ad data packet, including a 802.11ad preamble (802.11ad preamble) and 802.11ad data (802.11ad data).

Optionally, the set data sequence may include: an m sequence that repeats r times, where a length of each m sequence is L bits, and values of r and L may be set, for example, r=3, and L=127.

Optionally, the redundant bit may be n dummy bits (dummy bit), where n is also a set value, and may be set according to a time required for ADC switching, and for example, the time occupied by the n dummy bits is larger than or equal to a time required for switching from an N-bit ADC to an M-bit ADC, so as to ensure that the data that is in the standard frame structure and follows the redundant bit is sampled by using the M-bit ADC.

In addition, a receiving device performs sampling by using a 1-bit ADC during idle listening, and phase information of two channels, an in-phase component (in-phase, I channel) and a quadrature component (quadrature, Q channel), is discarded, so that the sending device may send the same set data sequence on the I channel and the Q channel. In this case, the data sequence received by the receiving device may be represented by:

$$r[n] = \begin{cases} \text{sgn}(\text{real}(w(n))) + j \times \text{sgn}(\text{imag}(w(n))); & \text{under } H_0 \\ \text{sgn}(\text{real}(Ae^{2\pi \Delta f \times Tn + \varphi} c[n] + w(n))) + \\ j \times \text{sgn}(\text{imag}(Ae^{2\pi \Delta f \times Tn + \varphi} c[n] + w(n))) \end{cases} ; \quad \text{under } H_1$$

where r[n] is the data sequence received by the receiving device, the I channel and the Q channel both receive r[n]; in an example in which a predetermined data sequence sent by the sending device is an m sequence, c(n) represents the m sequence sent by the sending device, w(n) represents random noise, A is an amplitude of a received signal, $\Delta f$ is a frequency deviation between a receiving end and a sending end, T is a period of a code element, $\phi$ is a random phase between a receiving end and a sending end; H0 represents a case in which no signal is received, and H1 represents a case in which an m-Preamble is received. In the H0 case, a receiver only receives random noise on two channels: I channel and Q channel; in the H1 case, there is an extremely strong main path at 60 GHz, and the m sequence has an extremely desirable autocorrelation property, so that an impact from non-main paths is ignored here, and their energy is also treated as random noise. real(x) represents a real part of a complex number x, image(x) represents an imaginary part of the complex number x, and sgn(x) represents a symbolic computation performed on x.

42: The sending device performs digital-to-analog conversion on the data sequence, and sends a data sequence that is obtained after the digital-to-analog conversion to a receiving device.

43: The receiving device samples, during idle listening, a received analog signal by using a 1-bit ADC, to obtain a data sequence and perform processing.

For example, referring to FIG. 3, in a hybrid ADC, the 1-bit ADC is connected, and an M-bit ADC is disconnected.

44: When detecting the set data sequence, the receiving device switches from the 1-bit ADC to the M-bit ADC, and samples the received analog signal by using the M-bit ADC to obtain the data sequence and perform processing.

Optionally, it may be determined, in an energy detection manner, whether the set data sequence is detected, for example, different data sequences may be set, and energy of the different data sequences is different even if lengths of the different data sequences are the same, so that detection may be performed according to the energy.

A calculation formula for energy detection may be as follows:

$$E[k] = \left\| \sum_{j=k}^{k+L} r_I[j] c_I[j] \right\|^2 + \left\| \sum_{j=k}^{k+L} r_Q[j] c_Q[j] \right\|^2$$

where E[k] is a result of the energy detection, $r_I[j], r_Q[j]$ are sampled values on the I channel and the Q channel separately, $c_I[j], c_Q[j]$ are set processing gains of the I channel and the Q channel separately, k is a first sampling point, L is a length of each m sequence, and $\|*\|^2$ represents a sum-of-squares operation.

The foregoing energy detection may be implemented by the baseband and MAC processor in FIG. 3, and when obtained E[k] is a set energy value, that is, the energy value is an energy value of the set data sequence, it may indicate that the set data sequence is detected. Then, the baseband and MAC processor may send a trigger signal, where the trigger signal may control a switch to switch from 1-bit ADC to M-bit ADC, so as to implement M-bit sampling.

Figure 6:
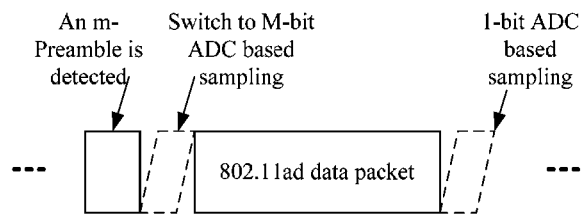
FIG. 6 is a schematic diagram of an operation mode of a receiving end according to an embodiment of the present invention.
Figure 7:
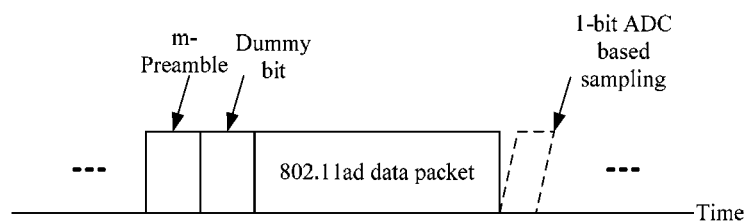
FIG. 7 is a schematic diagram of an operation mode of a sending end according to an embodiment of the present invention.

Then, when the receiving device returns to the idle listening, switching from the M-bit ADC back to the 1-bit ADC may be performed. FIG. 6 and FIG. 7 show schematic diagrams of operation modes of a receiving end and a sending end respectively, after the foregoing processing, the 1-bit ADC may be used during the idle listening, and the M-bit ADC may be used during normal receiving or sending of data.

The following provides a simulation result, where simulation conditions include: a length of an m sequence L=127, the number of cycles r=3, and an IEEE 802.11ad conference room channel is used to perform simulation. During the simulation, it is considered that initial phases of a receiving party and a sending party are arbitrary, and a frequency deviation of ±5 ppm exists on both a receiving end and a sending end.

Figure 8:
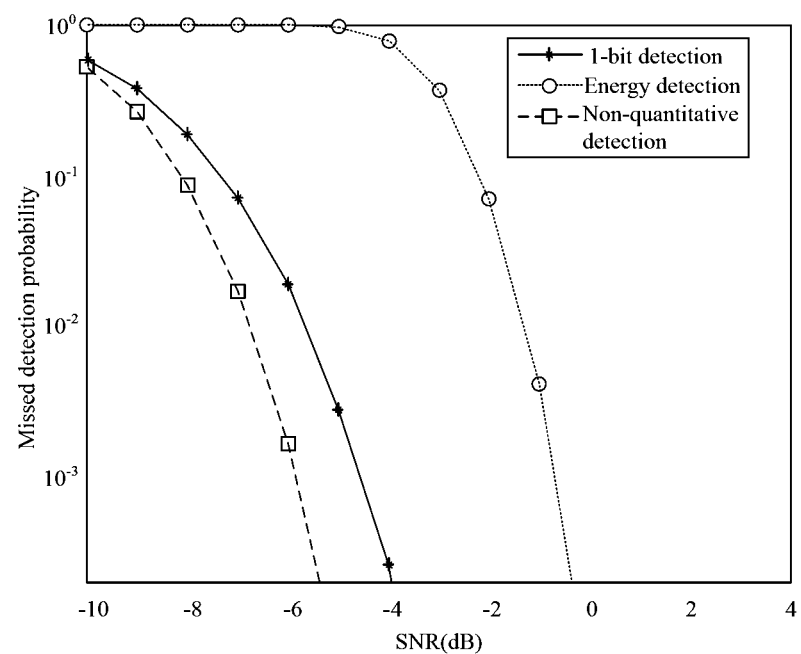
FIG. 8 is a schematic diagram of missed detection probability performance of 1-bit ADC based sampling and conventional technologies according to an embodiment of the present invention.

FIG. 8 is a schematic diagram of missed detection probability performance of 1-bit ADC based sampling and conventional technologies according to an embodiment of the present invention, where the conventional technologies are non-quantitative detection and energy detection separately, and the non-quantitative detection is a detection algorithm that currently has optimal performance on a missed detection probability of 1-bit detection. In a case in which it is ensured that a false alarm probability satisfies $P_{fa}=10^{-6}$, as shown in FIG. 8, when a signal to noise ratio SNR>−4.3 dB, the missed detection probability satisfies $P_m<10^{-3}$. When $P_m=10^{-3}$, compared with that of a non-quantitative detection algorithm, only 1.4 dB is lost, and compared with that of an energy detection algorithm that is originally used, an increase of 3.0 dB is achieved. Therefore, it can be seen that better missed detection performance can be achieved by using the 1-bit ADC based sampling according to the embodiment of the present invention.

Figure 9:
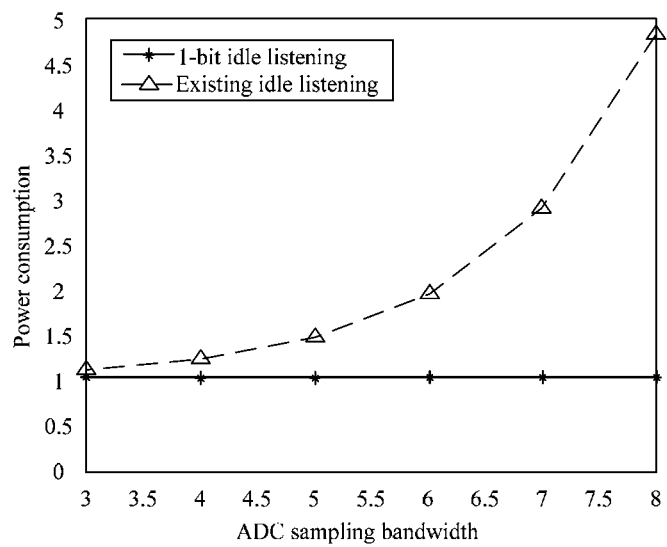
FIG. 9 is a schematic diagram of power consumption that is during idle listening and is of 1-bit ADC based sampling and a conventional technology according to an embodiment of the present invention.

FIG. 9 is a schematic diagram of power consumption that is during idle listening and is of 1-bit ADC based sampling and a conventional technology according to an embodiment of the present invention, where it is assumed that FOM=1.5 pJ/conv, and power consumption of a radio frequency front end is 1 W. It can be seen from FIG. 9 that, comparing with the conventional technology uses a 6-bit ADC, power consumption that is during idle listening and is of the 1-bit ADC of the embodiment of the present invention reduces by approximately 47.5%. Therefore, a large reduction in power consumption that is during idle listening and an improvement in performance are achieved at the cost of small hardware overhead.

According to the embodiment of the present invention, based on an existing frame structure, an m-preamble and a redundant bit are added for a frame structure of idle listening, so that a receiving end accurately performs ADC switching; a hybrid ADC may use, in a normal mode, an existing M-bit ADC, and enable, in an idle listening mode, a 1-bit ADC, to reduce power consumption during idle listening; two channels, I and Q, send a same m-preamble, and therefore high-performance frame arrival detection can be performed in a case in which phase information of 1-bit ADC based sampling on the two channels, I and Q, is unknown.

Figure 10:
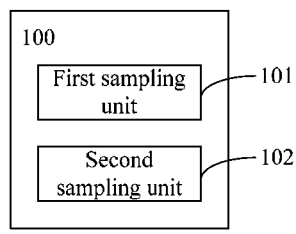
FIG. 10 is a schematic structural diagram of a receiving device according to an embodiment of the present invention.

FIG. 10 is a schematic structural diagram of an embodiment of a receiving device according to the present invention. The receiving device 100 includes a first sampling unit 101 and a second sampling unit 102; the first sampling unit 101 is configured to sample, in an idle listening mode, a first analog signal by using an N-bit ADC; the second sampling unit 102 is configured to sample, in a transceiving mode, a second analog signal by using an M-bit ADC, where N and M are both integers, and N is less than M.

Optionally, N is 1.

Figure 11:
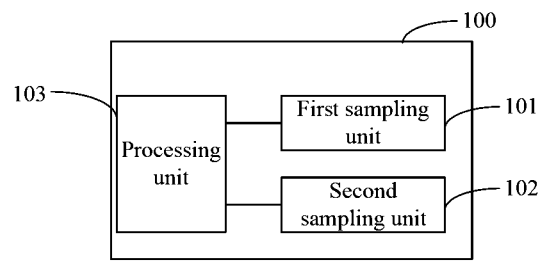
FIG. 11 is a schematic structural diagram of a receiving device according to another embodiment of the present invention.

Optionally, as shown in FIG. 11, the receiving device further includes: a processing unit 103, configured to determine whether a first data sequence is a set data sequence; the second sampling unit 102 is specifically configured to sample, when the processing unit 103 determines that the first data sequence is the set data sequence, the second analog signal by using the M-bit ADC to obtain a second data sequence.

Optionally, the processing unit 103 is specifically configured to: compare an energy value of the first data sequence with an energy value of the set data sequence; if the two energy values are the same, determine that the first data sequence is the set data sequence; and if the two energy values are not the same, determine that the first data sequence is not the set data sequence.

Optionally, the second data sequence includes: data in a standard frame structure; a time difference between the first data sequence and the second data sequence is a time occupied by a redundant bit.

Optionally, the set data sequence includes: an m sequence with r times of cycles, where a length of each m sequence is L, and r and L are both set values.

Optionally, the time occupied by the redundant bit is greater than or equal to a time required for switching from the N-bit ADC to the M-bit ADC.

The foregoing first sampling unit and second sampling unit may form a hybrid ADC shown in FIG. 3, and the processing unit may be located in a baseband and MAC processor in FIG. 3.

Figure 12:
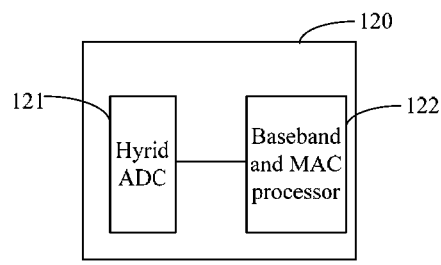
FIG. 12 is a schematic structural diagram of a receiving device according to another embodiment of the present invention.

That is, as shown in FIG. 12, the present invention may further provide a receiving device 120. The receiving device 120 includes a hybrid ADC 121, and the hybrid ADC 121 is configured to sample, in an idle listening mode, a first analog signal by using an N-bit ADC, and sample, in a transceiving mode, a second analog signal by using an M-bit ADC, where N and M are both integers, and N is less than M.

Optionally, N is 1.

Optionally, the receiving device may further include: a baseband and MAC processor 122, configured to determine whether a first data sequence obtained by sampling the first analog signal by using the N-bit ADC is a set data sequence.

The hybrid ADC 121 is specifically configured to sample, when the baseband and MAC processor 122 determines that the first data sequence obtained by sampling is the set data sequence, the second analog signal by using the M-bit ADC to obtain a second data sequence.

Optionally, the baseband and MAC processor 122 is specifically configured to determine, when an energy value of the first data sequence is the same as an energy value of the set data sequence, that the first data sequence obtained by sampling is the same as the set data sequence.

Optionally, the set data sequence includes: an m sequence with r times of cycles, where a length of each m sequence is L, and r and L are both set values;

the second data sequence includes: data in a standard frame structure; and a time difference between the first data sequence and the second data sequence is a time occupied by a redundant bit, and the time occupied by the redundant bit is greater than or equal to a time required for switching from the N-bit ADC to the M-bit ADC.

According to the embodiment, an effective sampling bit width of an ADC that is used during idle listening is N, which is less than an effective sampling bit width M in a transceiving mode; when a performance coefficient is fixed, power consumption is directly proportional to an effective sampling bit width, so that when the effective sampling bit width is reduced, the power consumption is also reduced, and therefore using a small effective sampling bit width can reduce the power consumption during the idle listening when ADC performance is fixed.

Figure 13:
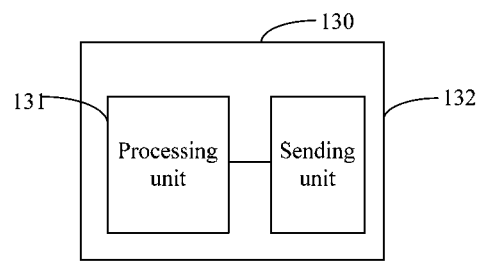
FIG. 13 is a schematic structural diagram of an embodiment of a sending device according to an embodiment of the present invention.

FIG. 13 is a schematic structural diagram of an embodiment of a sending device according to the present invention. The sending device 130 includes a processing unit 131 and a sending unit 132; the processing unit 131 is configured to generate a data sequence, and perform digital-to-analog conversion on the data sequence to obtain analog signals, where the analog signals include a first analog signal and a second analog signal; the sending unit 132 is configured to send the analog signals to a receiving device, so that the receiving device samples, in an idle listening mode, the first analog signal by using an N-bit ADC, and samples, in a transceiving mode, the second analog signal by using an M-bit ADC, where N and M are both integers, and N is less than M.

Optionally, the data sequence includes: a set data sequence, a redundant bit, and data in a standard frame structure.

Optionally, the set data sequence includes: an m sequence with r times of cycles, where a length of each m sequence is L, and r and L are both set values.

Optionally, a time occupied by the redundant bit is greater than or equal to a time required for switching from the N-bit ADC to the M-bit ADC.

Optionally, the first analog signal is an analog signal obtained after digital-to-analog conversion is performed on the set data sequence, and the second analog signal is an analog signal obtained after digital-to-analog conversion is performed on the data in the standard frame structure.

Figure 14:
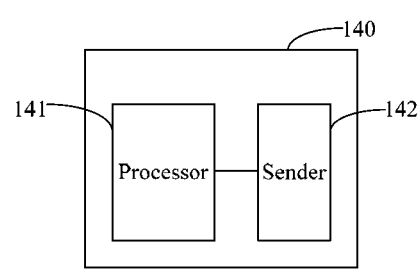
FIG. 14 is a schematic structural diagram of another embodiment of a sending device according to another embodiment of the present invention.

In addition, as shown in FIG. 14, the present invention provides another sending device. The sending device 140 includes a processor 141 and a sender 142; the processor 141 is configured to generate a data sequence, and perform digital-to-analog conversion on the data sequence to obtain analog signals, where the analog signals includes a first analog signal and a second analog signal; the sender 142 is configured to send the analog signal to a receiving device, so that the receiving device samples, in an idle listening mode, the first analog signal by using an N-bit ADC, and samples, in a transceiving mode, the second analog signal by using an M-bit ADC, where N and M are both integers, and N is less than M.

Optionally, the data sequence includes:

a set data sequence, a redundant bit and data in a standard frame structure, where the set data sequence includes an m sequence with r times of cycles, a length of each m sequence is L, r and L are both set values, and a time occupied by the redundant bit is greater than or equal to a time required for switching from the N-bit ADC to the M-bit ADC.

Optionally, the first analog signal is an analog signal obtained after digital-to-analog conversion is performed on the set data sequence, and the second analog signal is an analog signal obtained after digital-to-analog conversion is performed on the data in the standard frame structure.

The processor of the embodiment may specifically be a general purpose processor, a digital signal processor (DSP), an application-specific integrated circuit (ASIC), a field programmable gate array (FPGA) or another programmable logic device, a discrete gate or a transistor logic device, or a discrete hardware assembly. The general purpose processor may be a microprocessor or any conventional processor.

The foregoing sender may be implemented by using an antenna, where the antenna may be a linear antenna, a loop antenna, an antenna array, or the like.

In addition, the embodiment may further include a memory, a bus, and the like.

According to the embodiment of the present invention, using an ADC with a small effective sampling bit width to perform sampling during idle listening can reduce power consumption during idle listening when ADC performance is fixed.

Figure 15:
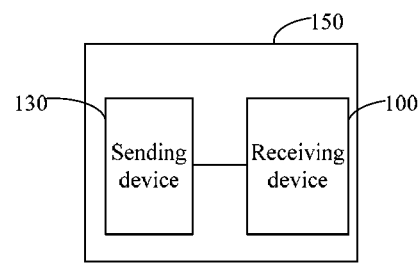
FIG. 15 is a schematic structural diagram of an embodiment of a communications system according to an embodiment of the present invention.

FIG. 15 is a schematic structural diagram of an embodiment of a communications system according to the present invention The system 150 includes a sending device 130 and a receiving device 100, and structures and functions of the sending device 130 and the receiving device 100 are as those described in the foregoing embodiments, and are not repeated herein. Alternatively, the system may also include a sending device 140 and a receiving device 120, and structures and functions of the sending device 140 and receiving device 120 are as those described in the foregoing embodiments, and are not repeated herein. It should be understood that, for the purpose of simplification, FIG. 15 only provides a case in which the system 150 includes the sending device 130 and the receiving device 100.

According to the embodiment, an effective sampling bit width of an ADC that is used during idle listening is N, which is less than an effective sampling bit width M in a transceiving mode; when a performance coefficient is fixed, power consumption is directly proportional to an effective sampling bit width, so that when the effective sampling bit width is reduced, the power consumption is also reduced, and therefore using a small effective sampling bit width can reduce the power consumption during the idle listening when ADC performance is fixed.

It may be clearly understood by a person skilled in the art that, for the purpose of convenient and brief description, division of the foregoing function modules is taken as an example for illustration. In actual application, the foregoing functions can be allocated to different function modules and implemented according to a requirement, that is, an inner structure of an apparatus is divided into different function modules to implement all or part of the functions described above. For a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present application essentially, or the part contributing to the prior art, or all or a part of the technical solutions may be implemented in the form of a software product. The software product is stored in a storage medium and includes several instructions for instructing a computer device (which may be a personal computer, a server, or a network device) or a processor to perform all or a part of the steps of the methods described in the embodiments of the present application. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing embodiments are merely intended for describing the technical solutions of the present application, but not for limiting the present application. Although the present application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present application.

What is claimed is:

1. A method for processing data during idle listening, comprising:
    sampling, in an idle listening mode, a first analog signal using a one-bit analog-to-digital converter (ADC); and
    sampling, in a transceiving mode, a second analog signal using an M-bit ADC, wherein
    M is an integer greater than 1.

2. The method according to claim 1, wherein a first data sequence is obtained by sampling the first analog signal using the N-bit ADC, the method further comprises:
    determining whether the first data sequence is a set data sequence; and
    wherein sampling, in the transceiving mode, the second analog signal using the M-bit ADC comprises:
    when the first data sequence is the set data sequence, sampling the second analog signal using the M-bit ADC to obtain a second data sequence.

3. The method according to claim 2, wherein determining whether the first data sequence is the set data sequence comprises:
    comparing an energy value of the first data sequence with an energy value of the set data sequence; if the energy value of the first data sequence is the same as the energy value of the set data sequence, determining that the first data sequence is the set data sequence.

4. The method according to claim 2, wherein
    the set data sequence comprises: an m sequence with r times of cycles, wherein a length of each m sequence is L, and r and L are both set values;
    the second data sequence comprises: data in a standard frame structure; and
    a time difference between the first data sequence and the second data sequence is a time occupied by a redundant bit, and the time occupied by the redundant bit is greater than or equal to a time required for switching from the N-bit ADC to the M-bit ADC.

5. A receiving device, comprising:
    a first sampling unit, configured to sample, in an idle listening mode, a first analog signal using a one-bit analog-to-digital converter (ADC); and
    a second sampling unit, configured to sample, in a transceiving mode, a second analog signal using an M-bit ADC, wherein
    M is an integer greater than 1.

6. The device according to claim 5, further comprising:
    a processing unit, configured to determine whether a first data sequence is a set data sequence, wherein the first data sequence is obtained by the first sampling unit sampling the first analog signal using the N-bit ADC; and
    the second sampling unit is configured to sample, when the processing unit determines that the first data sequence is the set data sequence, the second analog signal using the M-bit ADC to obtain a second data sequence.

7. The device according to claim 6, wherein the processing unit is configured to:
    compare an energy value of the first data sequence with an energy value of the set data sequence; if the energy value of the first data sequence is the same as the energy value of the set data sequence, determine that the first data sequence is the set data sequence.

8. The device according to claim 6, wherein the set data sequence comprises: an m sequence with r times of cycles, wherein a length of each m sequence is L, and r and L are both set values;
    the second data sequence comprises: data in a standard frame structure; and
    a time difference between the first data sequence and the second data sequence is a time occupied by a redundant bit, and the time occupied by the redundant bit is greater than or equal to a time required for switching from the N-bit ADC to the M-bit ADC.

9. A communications system, comprising a receiving device and a sending device, wherein,
    the receiving device is configured to sample, in an idle listening mode, a first analog signal using a one-bit analog-to-digital converter (ADC), and sample, in a transceiving mode, a second analog signal using an M-bit ADC, wherein M is an integer greater than 1; and
    the sending device is configured to communicate with the receiving device, generate a data sequence, and perform digital-to-analog conversion on the data sequence to obtain analog signals and send the analog signals to the receiving device, so that the receiving device samples the first analog signal and the second analog signal.

10. The system according to claim 9, wherein the data sequence comprises:
    a set data sequence, a redundant bit and data in a standard frame structure, wherein the set data sequence comprises an m sequence with r times of cycles, a length of each m sequence is L, r and L are both set values, and a time occupied by the redundant bit is greater than or equal to a time required for switching from the N-bit ADC to the M-bit ADC.

11. The system according to claim 9, wherein the receiving device is further configured to determine whether a first data sequence is a set data sequence, wherein the first data sequence is obtained by the first sampling unit sampling the first analog signal using the N-bit ADC; and when it is determined that the first data sequence is the set data sequence, the second analog signal using the M-bit ADC to obtain a second data sequence.

12. The system according to claim 11, wherein the set data sequence comprises: an m sequence with r times of cycles, wherein a length of each m sequence is L, and r and L are both set values;
    the second data sequence comprises: data in a standard frame structure; and
    a time difference between the first data sequence and the second data sequence is a time occupied by a redundant bit, and the time occupied by the redundant bit is greater than or equal to a time required for switching from the N-bit ADC to the M-bit ADC.

13. The system according to claim 11, wherein the receiving device is configured to:
    compare an energy value of the first data sequence with an energy value of the set data sequence; if the energy value of the first data sequence is the same as the energy value of the set data sequence, determine that the first data sequence is the set data sequence.

* * * * *